United States Patent [19]

Austin

[11] Patent Number: 4,533,864
[45] Date of Patent: Aug. 6, 1985

[54] TEST INSTRUMENT WITH FLEXIBLY CONNECTED HEAD

[75] Inventor: Hollis B. Austin, Manchester, N.H.

[73] Assignee: Northern Telecom Limited, Montreal, Canada

[21] Appl. No.: 487,058

[22] Filed: Apr. 21, 1983

[51] Int. Cl.³ .............................................. G01R 31/02
[52] U.S. Cl. ..................................... 324/51; 324/133; 324/72.5
[58] Field of Search ...................... 324/51, 72.5, 158 P, 324/133; 339/105; 179/175, 175.25, 175.3 R, 175.1 R

[56] References Cited

U.S. PATENT DOCUMENTS 3,369,214  2/1968  Krumreich et al. ................. 339/105
3,976,849  8/1976  Champan ...................... 179/175.3 R Primary Examiner—Stanley T. Krawczewicz
Assistant Examiner—Jack B. Harvey
Attorney, Agent, or Firm—Schwartz, Jeffery, Schwaab, Mack, Blumenthal & Evans

[57] ABSTRACT

An easily portable test instrument designed to be plugged into a wall socket such as a socket forming part of a telephone modular jack assembly has a barrel part containing test and alarm circuitry the barrel part connected to a rigid jack by a flexible neck through which leads pass to electrically connect the jack to the test and alarm circuitry.

11 Claims, 4 Drawing Figures

TEST INSTRUMENT WITH FLEXIBLY CONNECTED HEAD

This invention relates to a test instrument particularly adapted for checking the integrity of a circuit which terminates at a wall or other socket and to which other equipment is intended to be connected using a jack. The invention has particular application to an instrument for testing the parameters of a telephone loop circuit terminating at a wall socket.

To an increasing extent, telephone equipment used by the subscriber, instead of being owned and installed by the area telephone operating company is owned and installed by the subscriber, the only requirement being that the subscribed equipment be compatible with the area telephone company's transmission and switching equipment. In a situation like this where a fault appears on the subscriber's line it is important for the telephone company and the subscriber to know whether the fault has occured in the subscriber's own equipment or exists in the telephone company's equipment. Basically a simple and easy test must be carried out and the place to carry out that test is at the interface between the two equipments.

As a general policy telephone companies are now installing loops which terminate at a wall socket adapted to mate with a modular jack which is attached by a flexible cable to the telephone. A test instrument is now proposed specifically for use in conjunction with a wall socket which terminates a telephone or other electrical circuit.

According to the invention, there is provided a test instrument comprising a barrel portion containing test and indicating circuitry, a rigid connector portion mateable with a corresponding connector portion terminating a circuit to be tested, and a flexible neck portion joining the rigid connector portion to the barrel portion, the neck portion having mounted thereto leads interconnecting the rigid connector portion and the test and indicating circuitry within the barrel portion.

The flexible interconnection can be a block of flexible material such as a elastomer. A passage can extend through the block, the leads, in the form of a cable, extending through the passage. The rigid connector portion or test head can have a plastic body surrounding an indented part of the cable to lock the body onto the cable end. A series of contact bodies which can be crimped to specific ones of the electrical leads in the cable can be housed within the body. The plastic body of the test head can have a molded shape permitting sliding thereof into a corresponding second part of a modular jack assembly, during which sliding motion, said contact members contact corresponding contact members in the second part of the modular jack assembly.

The flexible neck portion can vary in cross-sectional area along its length in order to optimize strength and flexibility of the interconnection.

The barrel portion can have two parts which when clamped together affix a rear end of the flexible neck portion therebetween. The barrel portion can be generally of square or rectangular cross-section and can contain a circuit board on which the test and indicating circuit is mounted. The barrel portion can have a lower channel part housing the board and an upper cover plate bearing line checking indicia. The cover plate can be apertured to expose lamp indicators, for example, light emitting diodes, associated with the test and indicating circuit.

The test and indicating circuitry is preferably energized by current within the circuit to be tested. Particularly for testing tip and ring conditions of a telephone subscriber's loop, the test circuit can comprise a pair of terminals connectable to tip and ring respectively and three light emitting means connected across the terminals and selectively energizable by loop current, the first light emitting means energized by a reverse polarity condition of tip and ring, the second light emitting means energized by an abnormal low current, forward polarity condition of tip and ring, and the third light emitting means energized by a correct current, forward polarity condition of tip and ring. Preferably the light emitting means are colour coded showing green for a correct current condition and red for incorrect current conditions.

An embodiment of the invention will now be described by way of example with reference of the accompanying drawings in which.

Figure 1:
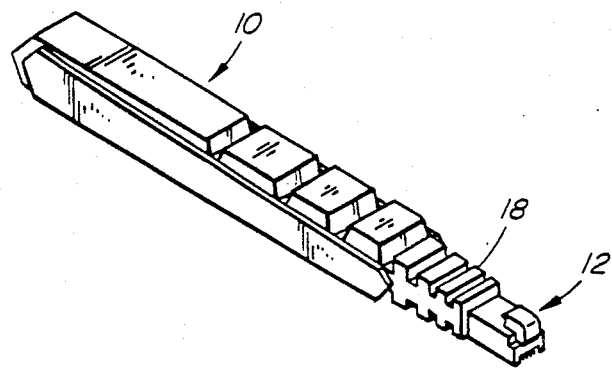
FIG. 1 is a perspective view of a test instrument according to the invention.
Figure 2:
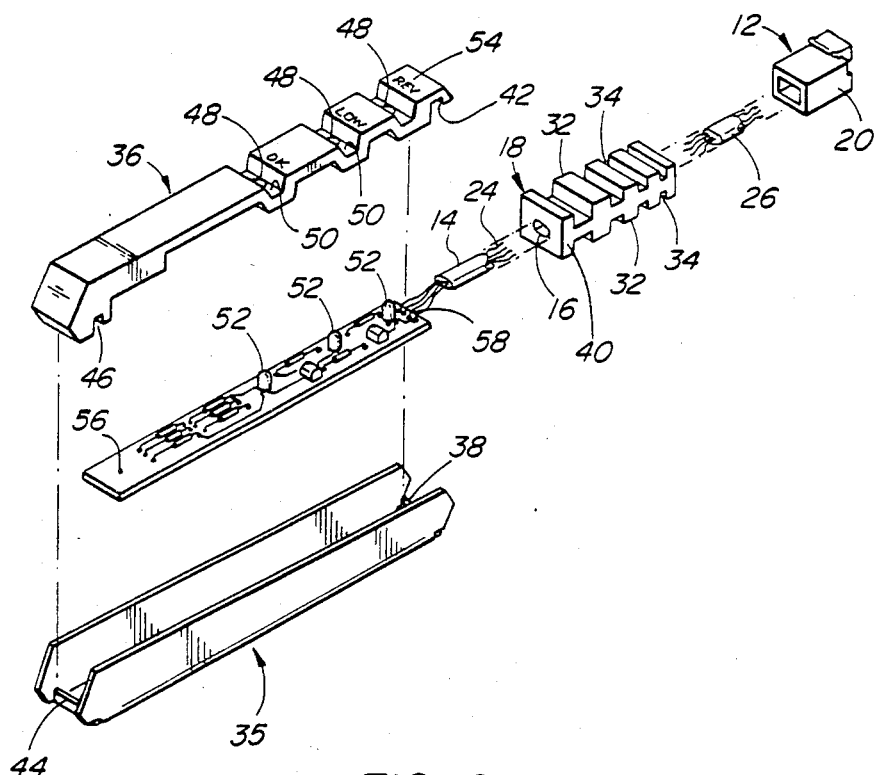
FIG. 2 is an exploded view of the FIG. 1 test instrument.

Referring to FIGS. 1 and 2 in detail, the telephone line checking instrument shown has a square section barrel part 10, a jack member 12 forming one part of a modular jack assembly, the other part (not shown) of the modular jack assembly terminating a telephone subscriber's loop at a wall fitting in the subscriber's premises. The barrel part and the jack member are joined by a flexible cable 14 extending through a passage 16 within a block 18 of an elastomer.

Figure 2A:
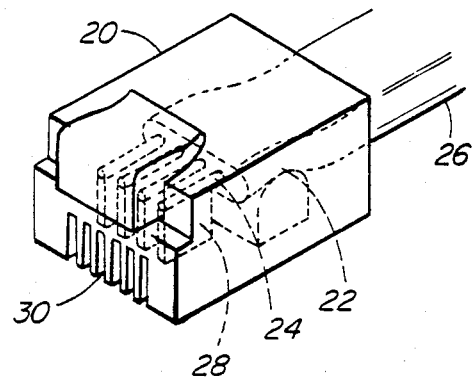
FIG. 2a shows a detail of the FIG. 1 test instrument.

Referring in detail to the exploded view of FIG. 2, the jack or male member has a shaped plastic body 20 with projections adapted to ensure correct insertion into a corresponding wall mounted female member of the modular jack assembly. The cable 14 enters the body 20 through an aperture in the rear of the body and is locked there following molding of the polycarbonate body 20 by crimping, causing a part of the body to extend into a depression 22 in the cable (FIG. 2a). Conductors 24 project beyond the end of cable sheath 26 and terminate at contact members 28 which are crimped to the individual bared conductors 24 and which are accommodated within grooves 30 in the molded body 20. In use, the jack slides into a wall socket where there are corresponding contact members which locate within those parts of the grooves 30 which are not filled by the contact members shown. The respective contact members are thus in side-by-side abutment.

The elastomer 18 has a square section to lend aesthetic continuity throughout the instrument, the barrel part 10 and the jack member 12 also having a substantially rectangular cross-section. The elastomer body 18 is formed with ribs 32 to optimize strength and stress relief when the elastomer block is subjected to shear forces on twisting. The ribs 32 and intervening grooves 34 are more densely located near the front end of the block than at the rear since this is the end required to be most flexible.

Although in this embodiment conductors 24 are taken through the center of the elastomer block, the conductors 24 could be mounted externally of the flexible connection. Moreover, although the elastomer block 18 represents the simplest implementation of a flexible mounting between the member 12 and the barrel part 10, the flexible connection may alternatively be a coiled spring with the conductors or cable passing within the spring. In another alternative, the elastomer block could be replaced by one or a series of articulated joints. The flexible coupling permits the test instrument to be held with an indicating face of the barrel part uppermost regardless of the orientation of the wall-mounted socket.

The barrel part 10 has a channel section plastic molding 35 and a molded cover plate 36. At the front of the channel section 35 is an upstanding flange 38. A rear part 40 of the elastomer block 18 is anchored behind the flange 38 and a corresponding downwardly extending flange 42 at the front of the cover plate 36. The channel section 35 also has an upstanding flange 44 at its rear end which locates in a groove 46 in the cover plate to fix the channel section 34 and the cover plate 36 in the relative positions shown in FIG. 1.

The cover plate is molded with a series of apertures 48 within depressed regions 50 as shown in FIG. 1. When the parts of the checking instrument are assembled the apertures accommodate lamps 52 in the form of light emitting diodes. Written indicia 54 on the raised parts of the cover plate 36 indicate the identity of the lamp.

Fixed into the base of the channel section 34 is an elongate circuit board 56 on which is mounted the test and indicating circuit including the LED's 52.

Figure 3:
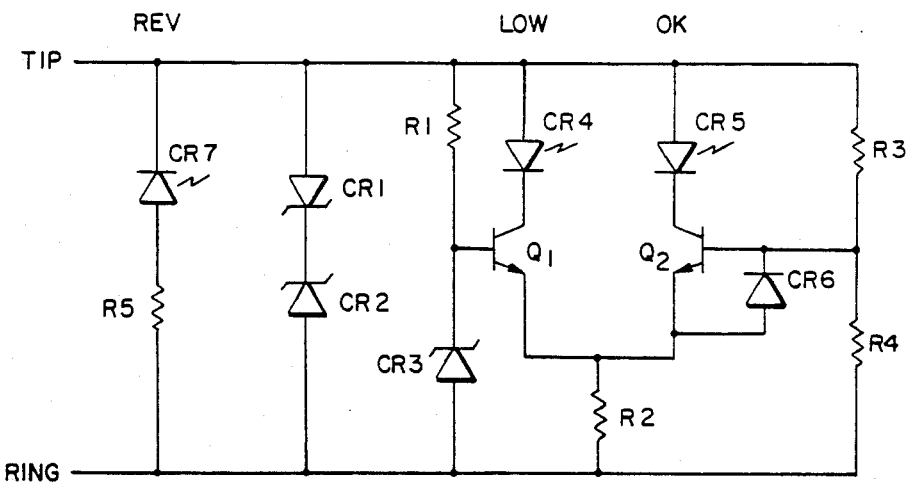
FIG. 3 is a schematic view of an electrical circuit contained within a barrel portion of the FIG. 1 test instrument.

This circuit is shown schematically in FIG. 3.

The circuit is intended to check the condition of tip and ring in the subscriber's loop and indicate immediately to the installer, repairperson or subscriber:

(i) whether the tip and ring conductors ar properly wired and the subscriber has sufficient loop current to operate the telephone or other type of telephone equipment;

(ii) whether the tip and ring conductors are reversed; or (iii) whether insufficient current is being supplied to the customer's telephone.

As shown in the control indicia on the cover plate and as shown in the FIG. 3 circuit diagram the tests are known respectively as "OK," "REV," and "LOW."

The three test links are each bridged across the tip and ring test rails which are intended to be connected to tip and ring lines of the subscriber's loop via terminals 58 on the circuit board, conductors 24 and abutting contact members 28.

The reverse test link is simply a series connected resistor R5 and light emitting diode CR7, the diode connected such as to conduct when ring voltage is greater than tip voltage. The tip and ring "OK" and "LOW" tests are performed by a differential amplifier incorporating transistors $Q_1$ and $Q_2$. A resistance divider network R3, R4 provides a bias to $Q_2$ which is dependant on the tip-to-ring voltage. The divider network R1, CR3 provides a constant voltage bias to $Q_1$ which is set by the characteristics of zener diode CR3. Because the emitter terminals of the transistors are at a common voltage which depends on R2, then when a positive tip-to-ring voltage is present one of the transistors is forward biased and conducts while the other is reversed biased and does not. The component values are chosen so that $Q_1$ conducts for a tip-to-ring voltage up to a threshold voltage and $Q_2$ conducts at a voltage greater than the threshold voltage.

Only one of the light emitting diodes CR4 and CR5 in the transistor collector circuits emits accordingly. Diode CR6 is present to prevent damage to transistor $Q_2$ occurring through high reverse bias. Similarly, back-to-back zener diodes CR1 and CR2 are provided to prevent damage to transistors $Q_1$ and $Q_2$ in the event of an overload voltage across the test terminals.

The specific embodiment described herein relates to test access at a wall mounted socket or jack. However, a test instrument such as that described can be used where the socket or jack member to be accessed is at a location other than the wall of a telephone subscriber's premises. Although the test instrument shows any one of three conditions of the subscriber's loop circuit, the tester must take additional steps to further diagnose at least two results of the test. Thus if the "REV" indicator is let then the particular reversal may be either at the jack being tested or at the station protection block. To diagnose which of these two situations exist, the tester simply tests the other jacks within the premises. Similarly if the "LOW" indicator is lit, the insufficient current to the customer's phone may be due to a receiver off-hook (ROH) or there may be a short or ground causing the problem. The types of problems might be further identified using a telephone or butt-in and normal trouble shooting procedures using equipment than the line testing instrument described here. The "LOW" indication may, in fact, not be due to a fault but to an excessively long loop without appropriate loop conditioning equipment.

Although in the contest of this embodiment the indicating devices used are light emitting diodes it will be appreciated that alternative electrically energized indicating devices such as liquid crystal cells could be substituted.

The test instrument described has a particular application in testing the tip and ring conditions of a telephone subscriber's loop. However it will be appreciated that particular advantages of this test instrument are its simplicity and the fact that regardless of the orientation in which a part of a modular jack assembly has been mounted within a wall, and in spite of the position in the wall, the test instrument offers ready access. The test and indicating circuity could be designed for testing other types of electrical circuit such as an electrical supply circuit.

What is claimed is:

1. A test instument comprising an elongated barrel portion containing test and indicating circuitry, a rigid connector portion mateable with a corresponding connector portion terminating a circuit to be tested, and a relatively short, flexible neck portion joining the rigid connector portion to the barrel portion, the neck portion having leads mounting thereto interconnecting the rigid connector portion and the test and indicating circuitry within the barrel portion.

2. A test instrument as claimed in claim 1 in which the flexible neck portion comprises a block of elastomer.

3. A test instrument as claimed in claim 2 in which the elastomer has a passage through which said leads extend in the form of a cable.

4. A test instrument as claimed in claim 3 in which the rigid connector portion has a molded plastic body surrounding an indented part of the cable whereby to lock the body onto the cable.

5. A test instrument as claimed in claim 1 in which a series of contact body members are fixably mounted in the connector portion and are crimped to specific ones of the electrical leads.

6. A test instrument as claimed in claim 1 in which the rigid connector portion has molded projecting pieces shaped to permit sliding of the rigid connector portion into the corresponding connector portion which also has contact body members mounted therein.

7. A test instrument as claimed in claim 2 in which the elastomer block varies in cross-sectional area whereby to optimize strength and flexibility.

8. a test instrument as claimed in claim 1 in which the barrel portion has two parts which are clamped together to anchor a rear end of the flexible neck portion therebetween.

9. A test instrument as claimed in claim 1 in which the barrel portion is of rectangular cross-section.

10. A test instument as claimed in claim 1, the barrel portion having a lower channel section containing the electrical circuit board and an upper cover plate bearing indicia.

11. A test instrument as claimed in claim 1 in which the cover plate is apertured to expose lamp indicators associated with the test and indicating circuit.

* * * * *